US006954116B2

(12) United States Patent
Nosaka

(10) Patent No.: US 6,954,116 B2
(45) Date of Patent: Oct. 11, 2005

(54) BALANCED-UNBALANCED CONVERTING CIRCUIT AND LAMINATED BALANCED-UNBALANCED CONVERTER

(75) Inventor: Koji Nosaka, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 80 days.

(21) Appl. No.: 10/752,545

(22) Filed: Jan. 8, 2004

(65) Prior Publication Data

US 2004/0164817 A1 Aug. 26, 2004

(30) Foreign Application Priority Data

Feb. 20, 2003 (JP) ....................................... 2003-043278
Nov. 14, 2003 (JP) ....................................... 2003-385431

(51) Int. Cl.[7] .................................................. H01P 5/10
(52) U.S. Cl. .......................................... 333/26; 333/204
(58) Field of Search .............................. 333/25, 26, 33, 333/116, 204, 246

(56) References Cited

U.S. PATENT DOCUMENTS 5,697,088 A * 12/1997 Gu ............................. 455/307
6,483,415 B1 * 11/2002 Tang .......................... 336/200

FOREIGN PATENT DOCUMENTS

JP 09-260145 10/1997

* cited by examiner

*Primary Examiner*—Dean Takaoka
(74) *Attorney, Agent, or Firm*—Keating & Bennett, LLP

(57) ABSTRACT

A balanced-unbalanced converting circuit includes first to fourth strip lines of a quarter wavelength or less. The first strip line has an end connected with a balanced terminal, and the third strip line has an end connected with an unbalanced terminal. The end of the first strip line connected to the balanced terminal opposes the end of the third strip line connected to the unbalanced terminal so that the first and third strip lines are electromagnetically coupled so as to define a coupler. The second strip line has an end connected with a balanced terminal, and the fourth strip line has an end connected with an open terminal. The end of the second strip line connected to the balanced terminal opposes the end of the fourth strip line connected to the open terminal so that the second and fourth strip lines are electromagnetically coupled so as to define a coupler.

16 Claims, 9 Drawing Sheets

BALANCED-UNBALANCED CONVERTING CIRCUIT AND LAMINATED BALANCED-UNBALANCED CONVERTER

BACKGROUND OF THE INVENTION

1. Field of the Invention

The present invention relates to a balanced-unbalanced converting (balun) circuit and a laminated balanced-unbalanced converter.

2. Description of the Related Art

Generally, merchant or marchand baluns and transformer baluns having a filter for use at high frequencies, such as microwave frequencies, are known. A merchant balun is described in, for example, Japanese Unexamined Patent Application Publication No. 9-260145.

FIG. 8 shows a balun circuit 1 of this type having strip lines 2 to 5. The strip line 2 is electrically connected between a balanced terminal 6 and a ground terminal G, and the strip line 3 is electrically connected between a balanced terminal 7 and the ground terminal G. The strip lines 4 and 5 are electrically connected in series between an unbalanced terminal 8 and an open terminal 9. The strip lines 2 and 4 are opposed to each other in such a manner that a first end 2*a* of the strip line 2 connected to the balanced terminal 6 is diagonally opposite to a first end 4*a* of the strip line 4 connected to the unbalanced terminal 8, and the opposing strip lines 2 and 4 are electromagnetically coupled. The strip lines 3 and 5 are also opposed to each other in such a manner that a first end 3*a* of the strip line 3 connected to the balanced terminal 7 is diagonally opposite to a first end 5*a* of the strip line 5 connected to the open terminal 9, and the opposing strip lines 3 and 5 are electromagnetically coupled.

In a narrow-band balun circuit, capacitors C1 to C4 indicated by imaginary lines in FIG. 8 are electrically connected between the ground terminal G and the balanced terminals 6 and 7, the unbalanced terminal 8, and the open terminal 9, respectively.

FIG. 9 shows another known balun circuit 11 having four LC parallel resonant circuits 12 to 15. In FIG. 9, the balun circuit 11 includes resonant capacitors C1 to C4, resonant coils L1 to L4, coupling capacitors Cs1 to Cs6, balanced terminals 16 and 17, an unbalanced terminal 18, an open terminal 19, and a ground terminal G.

However, the balun circuits 1 and 11 shown in FIGS. 8 and 9 have problems.

The balun circuit 1 shown in FIG. 8 has an attenuation characteristic in the vicinity of the transmission band and an attenuation characteristic for suppression of spurious signals, such as second and third harmonic suppression, but the amount of attenuation is limited. Thus, an external filter, such as a low-pass filter or a band-pass filter, is additionally required for an attenuation characteristic in the vicinity of the transmission band and a spurious-signal suppression function. This increases the circuit size, the number of circuit elements, and the insertion loss.

The balun circuit 11 shown in FIG. 9 has the LC parallel resonant circuits 12 to 15, and therefore requires a large number of elements, resulting in increased insertion loss.

SUMMARY OF THE INVENTION

In order to overcome the problems described above, preferred embodiments of the present invention provide a compact balanced-unbalanced converting circuit and laminated balanced-unbalanced converter with a high attenuation characteristic for spurious-signal suppression and a high attenuation characteristic in the vicinity of the transmission band.

A balanced-unbalanced converting circuit according to a preferred embodiment of the present invention includes a first strip line having a first end and a second end, the second end being electrically connected with a ground, a second strip line having a first end and a second end, the second end being electrically connected with the ground, a first balanced terminal electrically connected with the first end of the first strip line, a first capacitor electrically connected between the first balanced terminal and the ground, a second balanced terminal electrically connected with the first end of the second strip line, a second capacitor electrically connected between the second balanced terminal and the ground, a third strip line having a first end and a second end, a fourth strip line having a first end and a second end, the second end being electrically connected with the second end of the third strip line, an unbalanced terminal electrically connected with the first end of the third strip line, a third capacitor electrically connected between the unbalanced terminal and the ground, and a fourth capacitor electrically connected between the first end of the fourth strip line and the ground, wherein the first end and second end of the first strip line oppose the first end and second end of the third strip line, respectively, so that the first strip line and the third strip line are electromagnetically coupled, and the first end and second end of the second strip line oppose the first end and second end of the fourth strip line, respectively, so that the second strip line and the fourth strip line are electromagnetically coupled.

For example, in a laminated balanced-unbalanced converter, first, second, third, and fourth strip lines and first, second, third, and fourth capacitors are laminated via dielectric layers so as to define a laminate, and first and second balanced terminals, an unbalanced terminal, a ground terminal, and an open terminal are disposed on the laminate. The above-described balanced-unbalanced converting circuit is disposed in the laminate.

With this structure, spurious signals, such as second and third harmonics, are reliably eliminated and minimized, thus achieving a desirable attenuation characteristic.

The first balanced terminal may be electrically connected with a first trap circuit and the second balanced terminal may be electrically connected with a second trap circuit, thus achieving better attenuation characteristic in the vicinity of the transmission band. Each of the first and second trap circuits may include, for example, an LC parallel resonant circuit.

Each of the first balanced terminal and the second balanced terminal may be electrically connected with a device for adjusting the imaginary part of the impedance of the LC parallel resonant circuit, resulting in easy impedance adjustment. Such devices may be, for example, strip lines (coils).

According to a preferred embodiment of the present invention, furthermore, in the laminated balanced-unbalanced converter, the first and second strip lines may be provided on the same layer and the third and fourth strip lines may be provided on the same layer, and the first and second strip lines face the third and fourth strip lines via the dielectric layer. The thickness of the balanced-unbalanced converter can therefore be reduced.

According to a preferred embodiment of the present invention, furthermore, the laminate preferably includes a first trap circuit electrically connected with a first balanced terminal and a second trap circuit electrically connected with a second balanced terminal. Each of the first trap circuit and the second trap circuit includes an LC parallel resonant circuit having a coil. First and second capacitors are disposed between the first, second, third, and fourth strip lines and the coils of the first and second trap circuits in the lamination direction of the laminate. With this structure, capacitor electrodes of the first and second capacitors, which occupy large portions of the same dielectric layer, prevent magnetic coupling between the first, second, third, and fourth strip lines and the first and second trap circuits. Therefore, the size of the balanced-unbalanced converter can be reduced without deteriorating the insertion loss and the attenuation characteristic.

According to a preferred embodiment of the present invention, therefore, the first end and second end of the first strip line oppose the first end and second end of the third strip line, respectively, so that the first strip line and the third strip line are electromagnetically coupled, and the first end and second end of the second strip line oppose the first end and second end of the fourth strip line, respectively, so that the second strip line and the fourth strip line are electromagnetically coupled. The first to fourth capacitors are electrically connected between the ground and the first balanced terminal, the second balanced terminal, the unbalanced terminal, and the open terminal, respectively. This allows suppression of spurious signals, such as second and third harmonic suppression, thus achieving a balanced-unbalanced circuit or laminated balanced-unbalanced converter having better spurious-signal suppression. The first trap circuit and the second trap circuit are electrically connected with the first balanced terminal and the second balanced terminal, respectively, thus achieving a desirable attenuation characteristic in the vicinity of the transmission band.

Other features, elements, characteristics and advantages of the present invention will become more apparent form the following detailed description of preferred embodiments with reference to the attached drawings.

DETAILED DESCRIPTION OF PREFERRED EMBODIMENTS

A balanced-unbalanced converting circuit and laminated balanced-unbalanced converter according to preferred embodiments of the present invention will now be described with reference to the drawings.

First Preferred Embodiment

Figure 1:
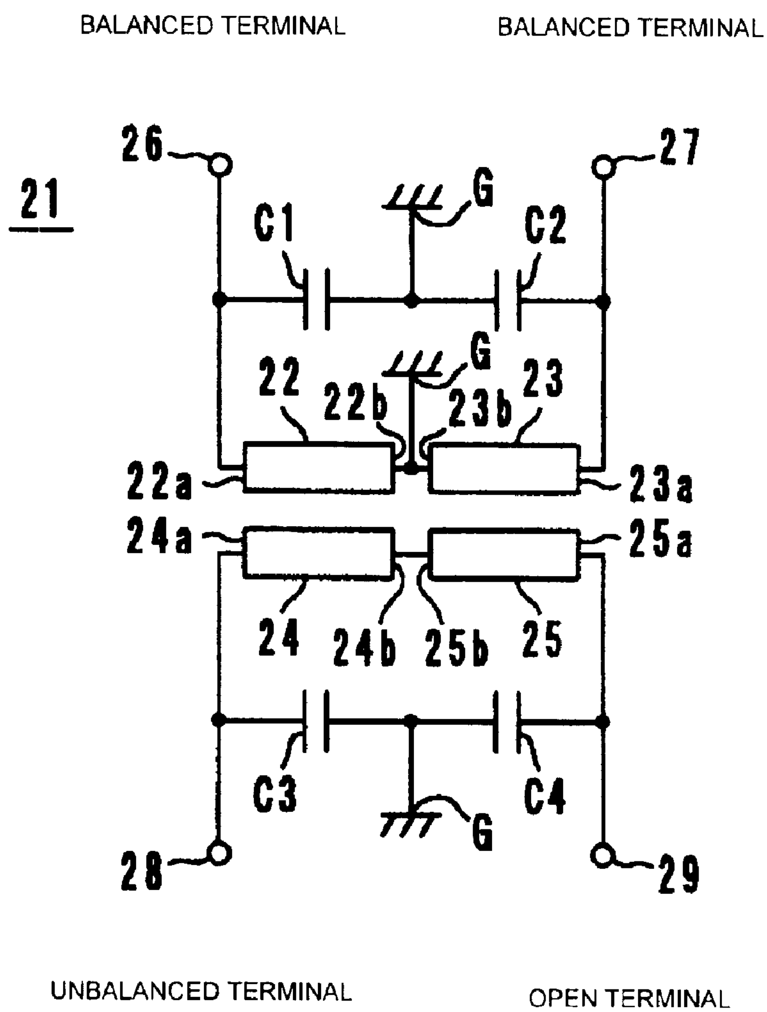
FIG. 1 is a circuit diagram of a balun circuit according to a first preferred embodiment of the present invention.

A balun circuit 21 according to a first preferred embodiment of the present invention will be described with reference to FIGS. 1 and 2. As shown in FIG. 1, the balun circuit 21 includes strip lines 22, 23, 24, and 25 of a quarter wavelength or less. The strip lines 22, 23, 24, and 25 have first ends 22*a*, 23*a*, 24*a*, and 25*a*, and second ends 22*b*, 23*b*, 24*b*, and 25*b*, respectively. The first end 22*a* of the strip line 22 is electrically connected with a balanced terminal 26, and the second end 22*b* thereof is electrically connected with a ground terminal G. The first end 23*a* of the strip line 23 is electrically connected with a balanced terminal 27, and the second end 23*b* thereof is electrically connected with the ground terminal G. The first end 24*a* of the strip line 24 is electrically connected with an unbalanced terminal 28, and the second end 24*b* thereof is electrically connected with the second end 25*b* of the strip line 25. The first end 25*a* of the strip line 25 is electrically connected with an open terminal 29.

The first end 22*a* of the strip line 22 connected to the balanced terminal 26 faces the first end 24*a* of the strip line 24 connected to the unbalanced terminal 28, and the second end 22*b* of the strip line 22 connected to the ground terminal G faces the second end 24*b* of the strip line 24 connected to the strip line 25, so that the strip lines 22 and 24 are electromagnetically coupled so as to define a coupler.

The first end 23*a* of the strip line 23 connected to the balanced terminal 27 faces the first end 25*a* of the strip line 25 connected to the open terminal 29, and the second end 23*b* of the strip line 23 connected to the ground terminal G faces the second end 25*b* of the strip line 25 connected to the strip line 24, so that the strip lines 23 and 25 are electromagnetically coupled so as to define a coupler.

Capacitors C1 to C4 are electrically connected between the ground terminal G and the balanced terminals 26 and 27, the unbalanced terminal 28, and the open terminal 29, respectively.

When the balun circuit 21 is used for a balanced-unbalanced signal converter, an unbalanced signal input from the unbalanced terminal 28 propagates through the strip line 24 and the strip line 25. Since the strip line 24 is electrically coupled with the strip line 22 and the strip line 25 is electrically coupled with the strip line 23, the unbalanced signal is converted into a balanced signal, and the resulting balanced signal is output from the balanced terminals 26 and 27.

A balanced signal input from the balanced terminals 26 and 27 is subjected to an operation that is reverse compared to the above-described operation so as to convert the balanced signal into an unbalanced signal. The resulting unbalanced signal is output from the unbalanced terminal 28.

Figure 2:
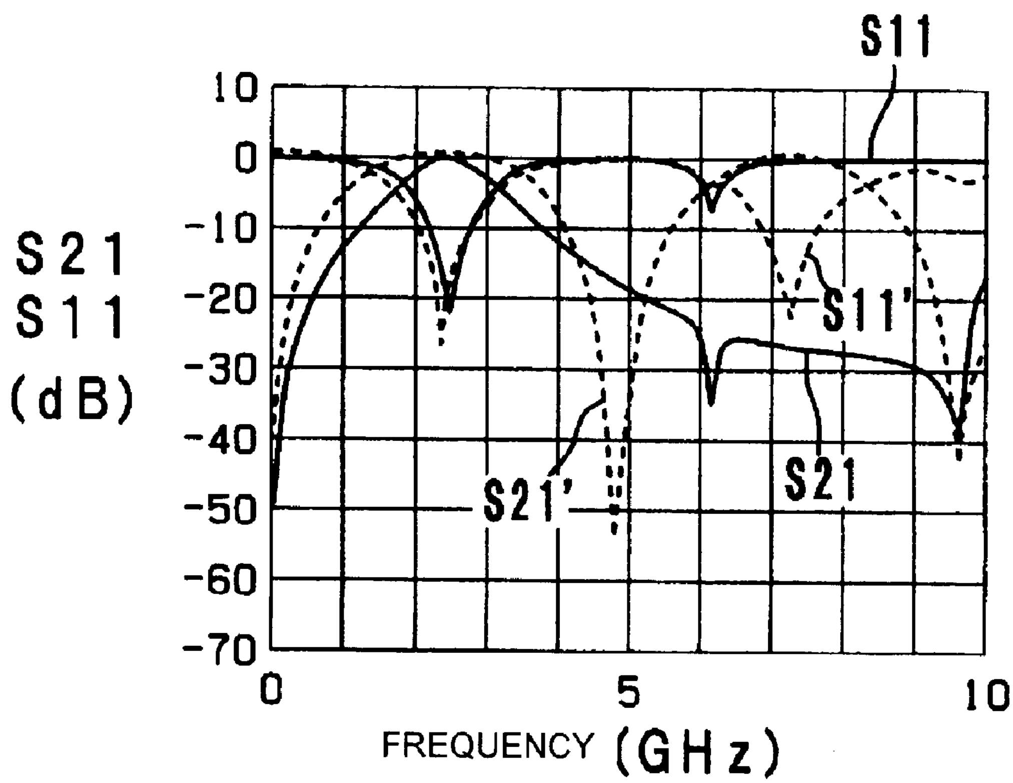
FIG. 2 is a graph showing the transmission (S21) characteristic and input reflection (S11) characteristic of the balun circuit shown in FIG. 1.
Figure 8:
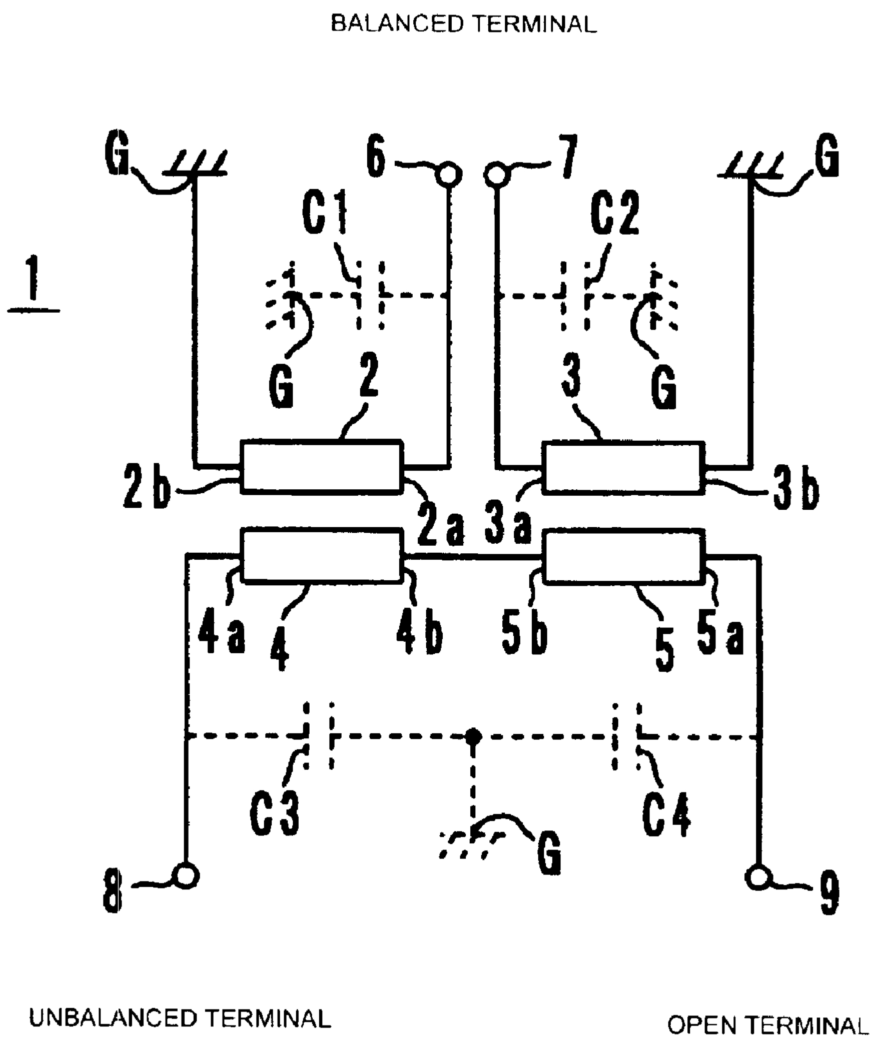
FIG. 8 is a circuit diagram of a balun circuit of the related art.
Figure 9:
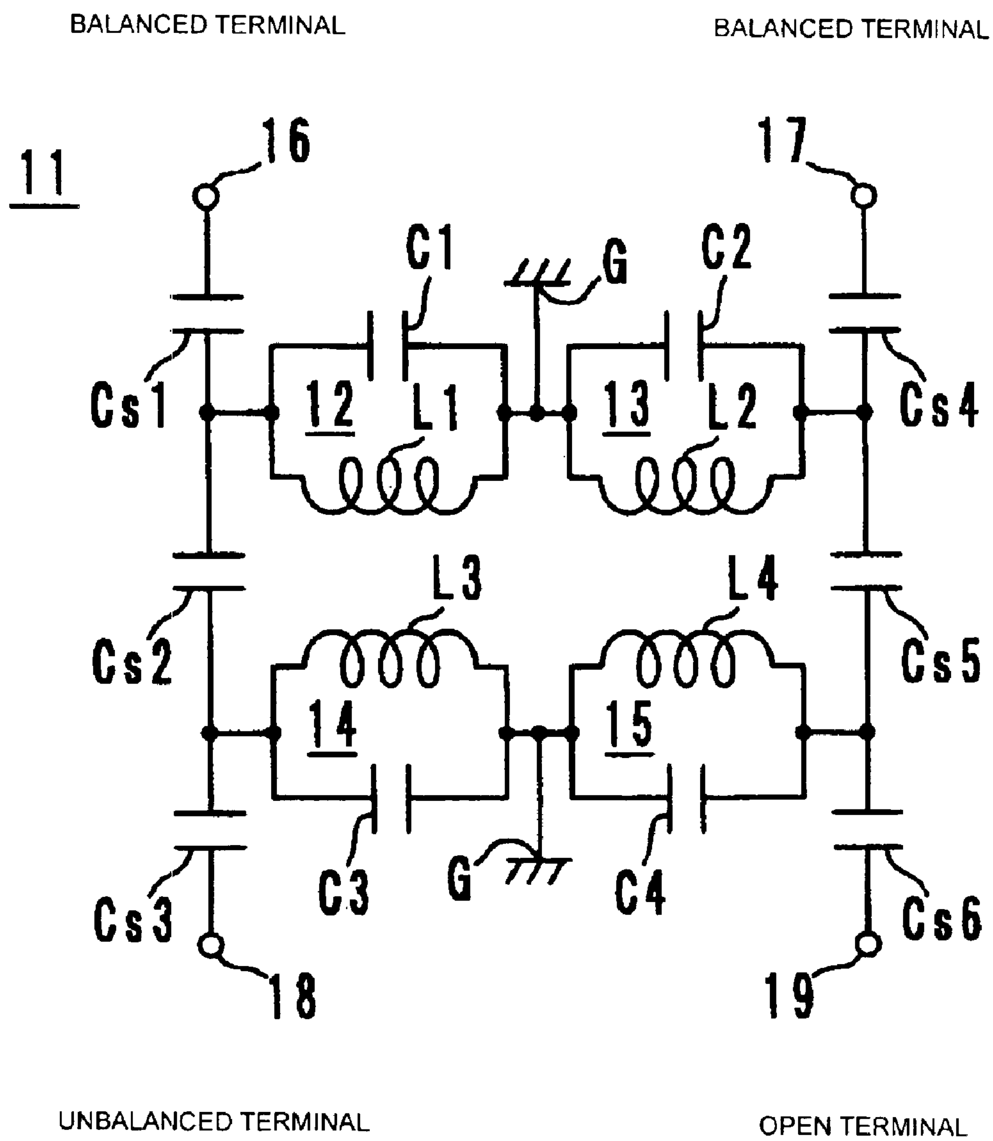
FIG. 9 is a circuit diagram of another balun circuit of the related art.

FIG. 2 is a graph showing the transmission (S21) characteristic and input reflection (S11) characteristic of the balun circuit 21, as indicated by solid lines S21 and S11, respectively. For the sake of comparison, FIG. 2 also shows the transmission (S21') characteristic and input reflection (S11') characteristic of the balun circuit 1 shown in FIG. 8, as indicated by dotted lines S21' and S11', respectively. As is clear from FIG. 2, the balun circuit 21 suppresses second and third harmonics, and has a high attenuation characteristic for spurious-signal suppression.

Second Preferred Embodiment

Figure 3:
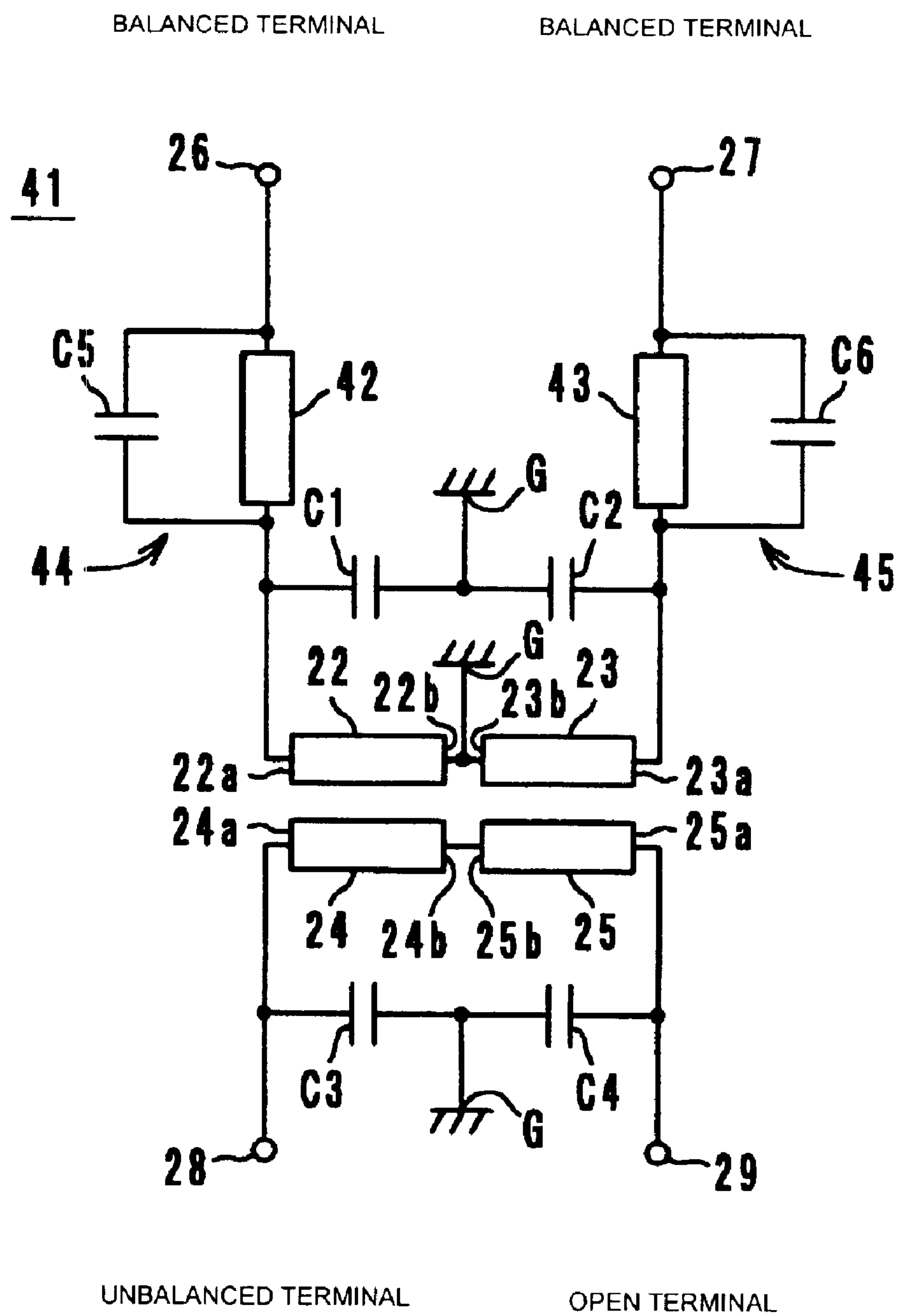
FIG. 3 is a circuit diagram of a balun circuit according to a second preferred embodiment of the present invention including trap circuits.

A balun circuit 41 according to a second preferred embodiment of the present invention will be described with reference to FIGS. 3 and 4. The balun circuit 41 shown in FIG. 3 is different from the balun circuit 21 shown in FIG. 1 in that a trap circuit 44 is electrically connected between the balanced terminal 26 and the strip line 22 and a trap circuit 45 is electrically connected between the balanced terminal 27 and the strip line 23. The trap circuit 44 is an LC parallel resonant circuit having a capacitor C5 and a coil (strip line) 42. The trap circuit 45 is preferably an LC parallel resonant circuit having a capacitor C6 and a coil (strip line) 43.

Figure 4:
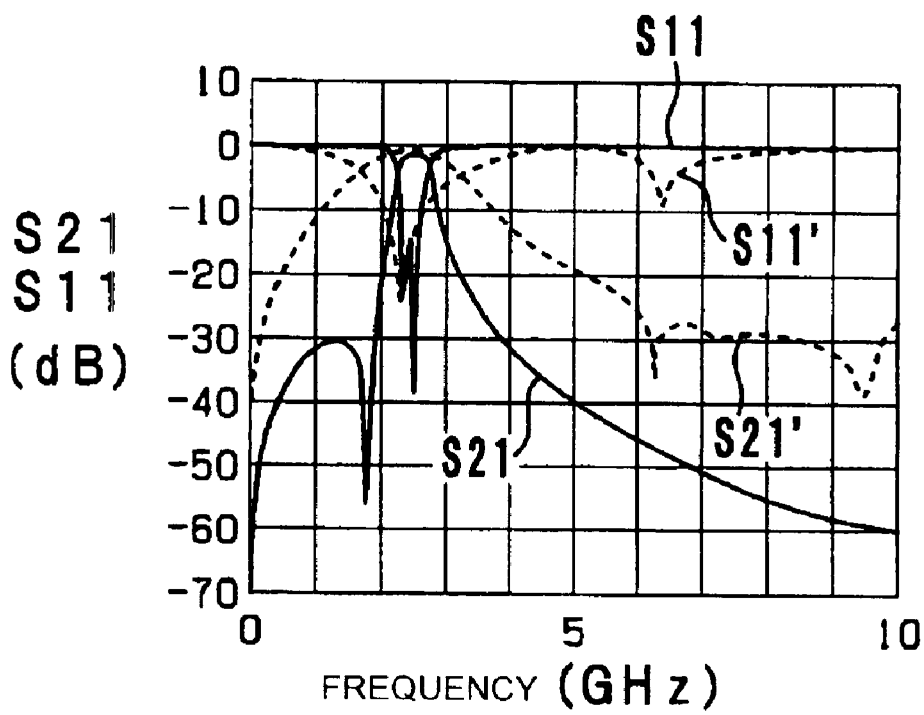
FIG. 4 is a graph showing the transmission (S21) characteristic and input reflection (S11) characteristic of the balun circuit shown in FIG. 3.

FIG. 4 is a graph showing the transmission (S21) characteristic and input reflection (S11) characteristic of the balun circuit 41, as indicated by solid lines S21 and S11, respectively. For the sake of comparison, FIG. 4 also shows the transmission (S21') characteristic and input reflection (S11') characteristic of the balun circuit 21 shown in FIG. 1, as indicated by dotted lines S21' and S11', respectively. As is clear from FIG. 4, the balun circuit 41 further suppresses second and third harmonics, and increases the amount of attenuation in the vicinity of the transmission band, thus achieving a higher attenuation characteristic.

Third Preferred Embodiment

Figure 5:
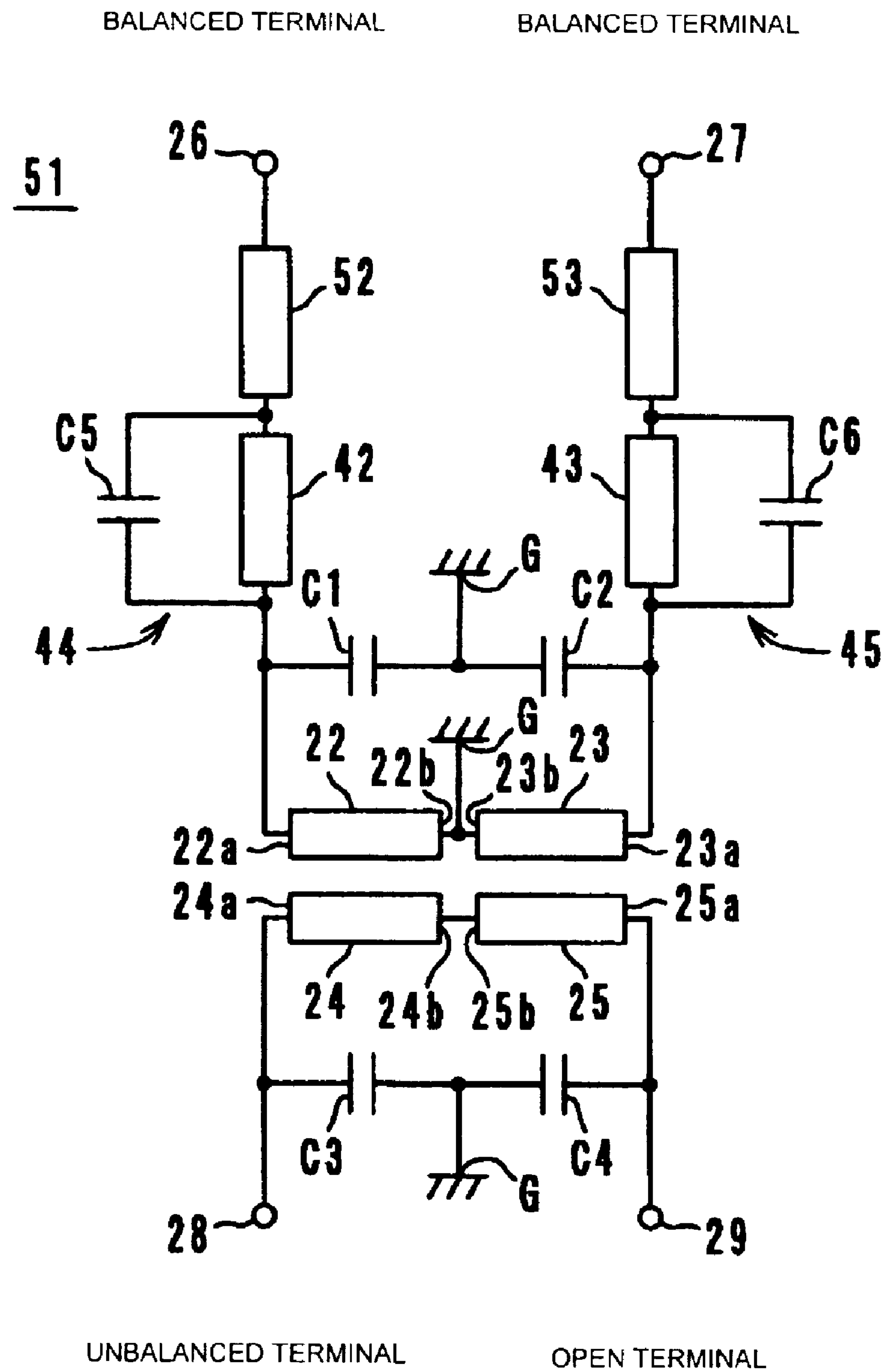
FIG. 5 is a circuit diagram of a balun circuit according to a third preferred embodiment of the present invention including devices for adjusting the imaginary part of the impedance.

A balun circuit 51 according to a third preferred embodiment of the present invention will be described with reference to FIGS. 5 to 7. The balun circuit 51 shown in FIG. 5 is different from the balun circuit 41 shown in FIG. 3 in that a coil (strip line) 52 is electrically connected between the balanced terminal 26 and the trap circuit 44 and a coil (strip line) 53 is electrically connected between the balanced terminal 27 and the trap circuit 45 in order to adjust the imaginary part of the impedance of the trap circuit 44 and 45, respectively. These coils allow for easy impedance adjusting of the trap circuits 44 and 45. Specifically, the longer the line lengths of the coils 52 and 53 to increase the inductance, the higher the imaginary part of the impedance; the shorter the line lengths of the coils 52 and 53 to reduce the inductance, the lower the imaginary part of the impedance.

Figure 6:
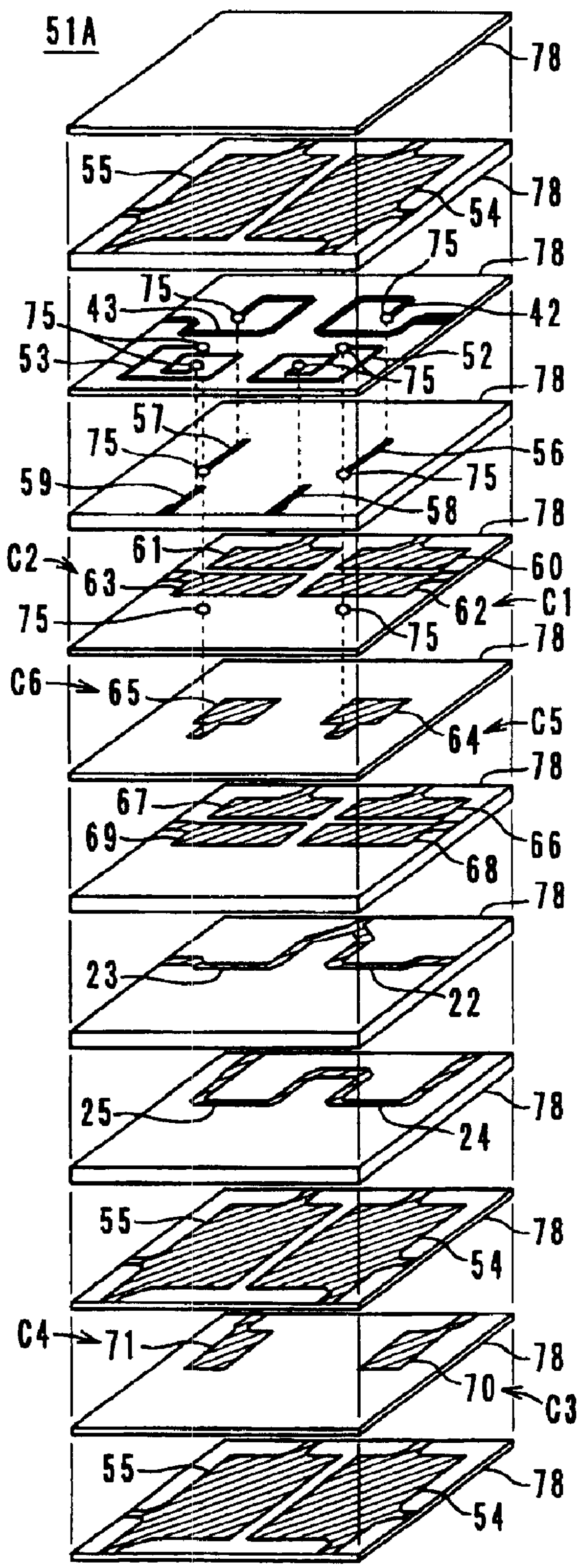
FIG. 6 is an exploded perspective view of a laminated balun converter according to a preferred embodiment of the present invention.

FIG. 6 is an exploded perspective view of a laminated balun converter 51A incorporating the balun circuit 51 shown in FIG. 5. The balun converter 51A includes a dielectric sheet 78 having ground electrodes 54 and 55 disposed on a surface thereof, a dielectric sheet 78 having the coils 42, 43, 52, and 53 disposed on a surface thereof, a dielectric sheet 78 having wiring electrodes 56 to 59 disposed on a surface thereof, a dielectric sheet 78 having ground electrodes 60 and 61 and capacitor electrodes 62 and 63 disposed on a surface thereof, a dielectric sheet 78 having capacitor electrodes 64 and 65 disposed on a surface thereof, a dielectric sheet 78 having ground electrodes 66 and 67 and capacitor electrodes 68 and 69 disposed on a surface thereof, a dielectric sheet 78 having the strip lines 22 and 23 of a quarter wavelength or less disposed on a surface thereof, a dielectric sheet 78 having the strip lines 24 and 25 of a quarter wavelength or less disposed on a surface thereof, a dielectric sheet 78 having capacitor electrodes 70 and 71 disposed on a surface thereof, a protective dielectric sheet 78 having no electrode provided on a surface thereof, and so on.

Each dielectric sheet 78 is preferably formed by mixing a dielectric ceramic powder with a binder or other suitable material and the mixture is formed into a sheet. The strip lines 22 to 25, the coils 42, 43, 52, and 53, the capacitor electrodes 62 and 63, etc., are preferably made of materials such as Ag, Ag—Pd, and Cu, or other suitable materials, and are formed by a method such as sputtering, vapor deposition, or printing, or other suitable process.

The strip lines 22 and 23 are disposed on the right-half and left-half sections of the same dielectric sheet 78, respectively. A first end of the strip line 22 is exposed on the right side of the dielectric sheet 78, and a first end of the strip line 23 is exposed on the left side of the dielectric sheet 78. Second ends of the strip lines 22 and 23 are joined and exposed in the center on the far side of the dielectric sheet 78.

The strip lines 24 and 25 are disposed on the right half and left half sections of the same dielectric sheet 78, respectively. First ends of the strip lines 24 and 25 are exposed on the right and left portions of the far side of the dielectric sheet 78, respectively. Second ends of the strip lines 24 and 25 are electrically connected with each other in the center of the dielectric sheet 78. The strip line 24 opposes the strip line 22 with the sheet 78 disposed therebetween. Thus, the strip lines 22 and 24 are electromagnetically coupled so as to define a coupler. The strip line 25 opposes the strip line 23 with the sheet 78 disposed therebetween. Thus, the strip lines 23 and 25 are electromagnetically coupled so as to define a coupler.

The ground electrodes 54 and 55 are arranged so as to occupy large portions of the right-half and left-half sections of the same dielectric sheet 78, respectively. The ground electrode 54 has three lead portions, one exposed right of the front side, one exposed center-right of the right side, and the other exposed on the far side of the sheet 78. The ground electrode 55 also has three lead portions, one exposed left of the front side, one exposed center-left of the left side, and the other exposed on the far side of the sheet 78.

The capacitor electrodes 70 and 71 are disposed on the right and left portions of the same dielectric sheet 78, respectively. The capacitor electrodes 70 and 71 have lead portions exposed right and left of the far side of the sheet 78, respectively. The capacitor electrode 70 opposes the ground electrode 54 with the sheet 78 disposed therebetween, thereby defining a capacitor C3. The capacitor electrode 71 opposes the ground electrode 55 with the sheet 78 disposed therebetween, thereby defining a capacitor C4.

The capacitor electrodes 62 and 63 are disposed on the right and left portions of the same sheet 78, respectively. The capacitor electrodes 68 and 69 are disposed on the right and left portions of the same sheet 78, respectively. The electrode ends of the capacitor electrode 62 and the ground electrode 60, and the electrode ends of the capacitor electrode 68 and the ground electrode 66 define a capacitor C1. The electrode ends of the capacitor electrode 63 and the ground electrode 61, and the electrode ends of the capacitor electrode 69 and the ground electrode 67 define a capacitor C2.

The capacitor electrode 64 opposes the capacitor electrodes 62 and 68 with the sheets 78 disposed therebetween, thereby defining a capacitor C5. The capacitor electrode 65 opposes the capacitor electrodes 63 and 69 with the sheets 78 disposed therebetween, thereby defining a capacitor C6.

The coils 42 and 43 each preferably having a spiral shape are disposed on the right and left portions of the same dielectric sheet 78, respectively. An end of the coil 42 is exposed on the right side of the sheet 78. The other end of the coil 42 is electrically connected with an end of the coil 52 and the capacitor electrode 64 via the wiring electrode 56 and via-holes 75 formed in the sheets 78. The coil 42 and the capacitor C5 define an LC parallel resonant circuit (trap circuit) 44. An end of the coil 43 is exposed on the left side of the sheet 78. The other end of the coil 43 is electrically connected with an end of the coil 53 and the capacitor electrode 65 via the via-holes 75 and the wiring electrode 57. The coil 43 and the capacitor C6 define an LC parallel resonant circuit (trap circuit) 45.

The other end of the spiral coil 52 extends to the center-right of the front side of the sheet 78 via the via-hole 75 and the wiring electrode 58. The other end of the spiral coil 53 extends to the center-left of the front side of the sheet 78 via the via-hole 75 and the wiring electrode 59.

Figure 7:
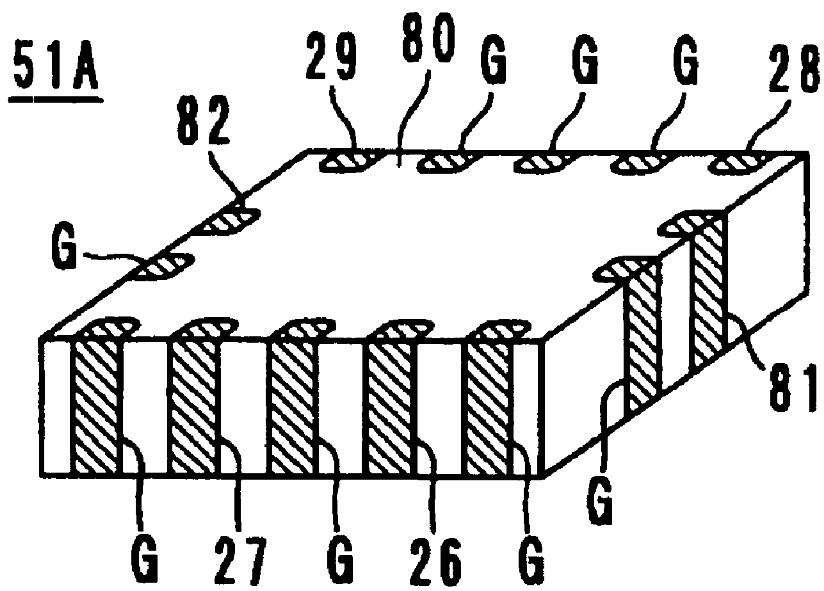
FIG. 7 is an external perspective view of the laminated balun converter shown in FIG. 6.

The sheets 78 are laminated and fired integrally to form a laminate 80 shown in FIG. 7. Balanced terminals 26 and 27 and ground terminals G are alternately arranged on the front surface of the laminate 80. An unbalanced terminal 28 and an open terminal 29 are arranged to have ground terminals G disposed therebetween on the far side of the laminate 80. An inter-layer connection terminal 81 and a ground terminal G are disposed on the right side surface of the laminate 80, and an inter-layer connection terminal 82 and a ground terminal G are disposed on the left side surface of the laminate 80.

The balanced terminals 26 and 27 are electrically connected with the wiring electrodes 58 and 59, respectively. The unbalanced terminal 28 is electrically connected with the end of the strip line 24 and the capacitor electrode 70, and the open terminal 29 is electrically connected with the end of the strip line 25 and the capacitor electrode 71. The inter-layer connection terminal 81 is electrically connected with the end of the coil 42, the capacitor electrodes 62 and 68, and the end of the strip line 22. The inter-layer connection terminal 82 is electrically connected with the end of the coil 43, the capacitor electrodes 63 and 69, and the end of the strip line 23. The ground terminals G are electrically connected with the ground electrodes 54, 55, 60, 61, 66, and 67, and the joint end of the strip lines 22 and 23.

In the laminated balun converter 51A having the above-described structure, the strip lines 22 and 23 are provided on the same dielectric sheet 78, and the strip lines 24 and 25 are provided on the same dielectric sheet 78, thus reducing the thickness of the laminated balun converter 51A. In general, magnetic coupling between the strip lines 22 to 25 and the trap circuits 44 and 45 degrades the insertion loss and the attenuation characteristic. In the third preferred embodiment of the present invention, therefore, between the layer having the strip lines 22 and 23 and the layer having the coils 42 and 43 defining the trap circuits 44 and 45, the capacitor electrodes 62 to 65, 68, and 69, and the ground electrodes 60, 61, 66, and 67 having large areas are provided. The capacitor electrodes 62 to 65, 68, and 69 and the ground electrodes 60, 61, 66, and 67 minimize the magnetic coupling between the strip lines 22 and 23 and the coils 42 and 43, thus reducing the distance between the strip lines 22 and 23 and the coils 42 and 43. Therefore, the size of the balun converter 51A can be reduced without degrading the insertion loss and the attenuation characteristic.

Other Preferred Embodiments

The present invention is not limited to the first to third preferred embodiments, and a variety of modifications may be made without departing from the spirit and scope of the invention. Particularly, the strip lines 22 to 25 may have any shape, and may be linear, spiral, or meandering. The strip lines 22 to 25 do not have to be designed to have a quarter wavelength or less.

In the first to third preferred embodiments, dielectric sheets having strip lines, etc., are laminated and fired integrally. However, the present invention is not limited thereto. The sheets may be burned in advance. The laminated balun converter according to the present invention may be manufactured by the following method: a dielectric paste is applied by a technique, such as printing, to form a dielectric layer; a conductive paste is applied to a surface of the dielectric layer to form a strip line or electrode of any shape; a dielectric paste is applied over the strip line or the like, and with overlaying applications in this order, a balun converter having a laminate structure is achieved.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A balanced-unbalanced converting circuit comprising:

a first strip line having a first end and a second end, the second end of the first strip line being electrically connected with a ground;

a second strip line having a first end and a second end, the second end of the second strip line being electrically connected with the ground;

a first balanced terminal electrically connected with the first end of the first strip line;

a first capacitor electrically connected between the first balanced terminal and the ground;

a second balanced terminal electrically connected with the first end of the second strip line;

a second capacitor electrically connected between the second balanced terminal and the ground;

a third strip line having a first end and a second end;

a fourth strip line having a first end and a second end, the second end of the fourth strip line being electrically connected with the second end of the third strip line;

an unbalanced terminal electrically connected with the first end of the third strip line;

a third capacitor electrically connected between the unbalanced terminal and the ground; and a fourth capacitor electrically connected between the first end of the fourth strip line and the ground; wherein the first end and the second end of the first strip line oppose the first end and the second end of the third strip line, respectively, so that the first strip line and the third strip line are electromagnetically coupled, and the first end and the second end of the second strip line oppose the first end and the second end of the fourth strip line, respectively, so that the second strip line and the fourth strip line are electromagnetically coupled.

2. A balanced-unbalanced converting circuit according to claim 1, wherein the first balanced terminal is electrically connected with a first trap circuit, and the second balanced terminal is electrically connected with a second trap circuit.

3. A balanced-unbalanced converting circuit according to claim 2, wherein each of the first trap circuit and the second trap circuit includes an LC parallel resonant circuit, and each of the first balanced terminal and the second balanced terminal is electrically connected with a device for adjusting an imaginary part of the impedance of the LC parallel resonant circuit.

4. A balanced-unbalanced converting circuit according to claim 1, wherein the first, second, third and fourth strip lines have a length of approximately a quarter wavelength or less.

5. A balanced-unbalanced converting circuit according to claim 1, wherein the first and third strip lines are electromagnetically coupled so as to define a coupler.

6. A balanced-unbalanced converting circuit according to claim 1, wherein the second and fourth strip lines are electromagnetically coupled so as to define a coupler.

7. A balanced-unbalanced converting circuit according to claim 1, wherein a first coil is electrically connected between the first balanced terminal and the first trap circuit and a second coil is electrically connected between the second balanced terminal and the second trap circuit.

8. A balanced-unbalanced converting circuit according to claim 3, wherein the device for adjusting an imaginary part of the impedance of the LC parallel resonant circuit includes a coil.

9. A laminated balanced-unbalanced converter comprising:

first, second, third, and fourth strip lines each having a first end and a second end;

first, second, third, and fourth capacitors;

the first, second, third, and fourth strip lines and the first, second, third, and fourth capacitors being laminated via dielectric layers in a lamination direction to define a laminate; and first and second balanced terminals, an unbalanced terminal, a ground terminal, and an open terminal disposed on the laminate; wherein the first end of the first strip line is electrically connected with the first balanced terminal, the first end of the second strip line is electrically connected with the second balanced terminal, and the second end of the first strip line and the second end of the second strip line are electrically connected with the ground terminal;

the first end of the third strip line is electrically connected with the unbalanced terminal, the first end of the fourth strip line is electrically connected with the open terminal, and the second end of the third strip line is electrically connected with the second end of the fourth strip line;

the first capacitor is electrically connected between the first balanced terminal and the ground terminal, the second capacitor is electrically connected between the second balanced terminal and the ground terminal, the third capacitor is electrically connected between the unbalanced terminal and the ground terminal, and the fourth capacitor is electrically connected between the open terminal and the ground terminal; and the first end and the second end of the first strip line oppose the first end and the second end of the third strip line, respectively, so that the first strip line and the third strip line are electromagnetically coupled, and the first end and the second end of the second strip line oppose the first end and the second end of the fourth strip line, respectively, so that the second strip line and the fourth strip line are electromagnetically coupled.

10. A laminated balanced-unbalanced converter according to claim 9, wherein the first and the second strip lines are disposed on the same dielectric layer, and the third and the fourth strip lines are disposed on the same dielectric layer, the first strip line opposing the third strip line via the dielectric layer and the second strip line opposing the fourth strip line via the dielectric layer.

11. A laminated balanced-unbalanced converter according to claim 9, wherein the laminate includes a first trap circuit electrically connected with the first balanced terminal, and a second trap circuit electrically connected with the second balanced terminal, each of the first trap circuit and the second trap circuit including an LC parallel resonant circuit having a coil, and the first and second capacitors are disposed between the first, second, third, and fourth strip lines and the coils of the first and second trap circuits in the lamination direction of the laminate.

12. A laminated balanced-unbalanced converter according to claim 11, wherein each of the first balanced terminal and the second balanced terminal is electrically connected with a device for adjusting an imaginary part of the impedance of the LC parallel resonant circuit.

13. A laminated balanced-unbalanced converter according to claim 9, wherein the first, second, third and fourth strip lines have a length of approximately a quarter wavelength or less.

14. A laminated balanced-unbalanced converter according to claim 9, wherein the first and third strip lines are electromagnetically coupled so as to define a coupler.

15. A laminated balanced-unbalanced converter according to claim 9, wherein the second and fourth strip lines are electromagnetically coupled so as to define a coupler.

16. A laminated balanced-unbalanced converter according to claim 11, wherein a first coil is electrically connected between the first balanced terminal and the first trap circuit and a second coil is electrically connected between the second balanced terminal and the second trap circuit.

* * * * *